US012587177B2

(12) United States Patent
Fan

(10) Patent No.: US 12,587,177 B2
(45) Date of Patent: Mar. 24, 2026

(54) CIRCUIT ARRANGEMENT AND METHOD OF FORMING THE SAME

(71) Applicant: Advanced Instrument PTE. LTD., Singapore (SG)

(72) Inventor: Chengge Fan, Singapore (SG)

(73) Assignee: Advanced Instrument PTE. LTD., Singapore (SG)

( * ) Notice: Subject to any disclaimer, the term of this patent is extended or adjusted under 35 U.S.C. 154(b) by 0 days.

(21) Appl. No.: 18/717,588

(22) PCT Filed: Dec. 8, 2021

(86) PCT No.: PCT/SG2021/050771
§ 371 (c)(1),
(2) Date: Jun. 7, 2024

(87) PCT Pub. No.: WO2023/106997
PCT Pub. Date: Jun. 15, 2023

(65) Prior Publication Data
US 2025/0047266 A1 Feb. 6, 2025

(51) Int. Cl.
*H03K 3/017* (2006.01)
*H03K 17/687* (2006.01)

(52) U.S. Cl.
CPC ......... *H03K 3/017* (2013.01); *H03K 17/6871* (2013.01)

(58) Field of Classification Search
CPC . H03K 3/017; H03K 17/6871; H02M 1/0009; H02M 3/156; H02M 1/0054
See application file for complete search history.

(56) References Cited

U.S. PATENT DOCUMENTS

| | | | |
|---|---|---|---|
| 5,450,727 A | 9/1995 | Ramirez et al. | |
| 6,205,790 B1 | 3/2001 | Denkin et al. | |
| 6,486,643 B2 | 11/2002 | Liu | |
| 7,817,452 B2 * | 10/2010 | Smith ............... | H02M 3/33573 363/56.02 |
| 2008/0252277 A1 | 10/2008 | Sase et al. | |
| 2014/0133206 A1 | 5/2014 | Shoji et al. | |

(Continued)

FOREIGN PATENT DOCUMENTS

| | | |
|---|---|---|
| CN | 104935204 A | 9/2015 |
| CN | 105262339 A | 1/2016 |

(Continued)

OTHER PUBLICATIONS

Liu, Shoumin, Thermoelectric Cooler Control Using the DS4830 Optical Microcontroller, Aug. 17, 2012, https://www.analog.com/ en/resources/app-notes/thermoelectric-cooler-control-using-the-ds4830-optical-microcontroller.html, 27 pages.

(Continued)

*Primary Examiner* — Metasebia T Retebo

(57) ABSTRACT

Various embodiments mat relate to a circuit arrangement including a main controller. The circuit arrangement may also include a pulse width modulation driver in electrical connection with the main controller. The circuit arrangement may additionally include a switch selector in electrical connection with the main controller. The circuit arrangement may also include a first switch, a second switch, a third switch and a fourth switch, as well as an inductor and a capacitor.

20 Claims, 14 Drawing Sheets

(56) References Cited

U.S. PATENT DOCUMENTS

2020/0382035 A1 * 12/2020 Pacha ..................... H02P 21/22
2021/0305912 A1    9/2021 Chang

FOREIGN PATENT DOCUMENTS

| | | | | | |
|---|---|---|---|---|---|
| CN | 106685251 A | * | 5/2017 | ............ | H02M 7/587 |
| CN | 111600502 A | | 8/2020 | | |
| JP | 2020150673 A | * | 9/2020 | | |
| KR | 1020180008990 A | | 1/2018 | | |

OTHER PUBLICATIONS

VBMB Pte Ltd, "New High Performance TEC Controller Designs," Precision Control Solutions Made Simple, White Paper, 4 Pages, 2023.
Written Opinion of the International Searching Authority, PCT/SG2021/050771, Date of Mailing Mar. 17, 2022, 5 pages.

* cited by examiner

FIG. 5A

VP — | Load | — VN        Vload=VP-VN

| | Conventional Buck Circuit | | Embodiment | |
|---|---|---|---|---|
| | PWM1 | PWM2 | PWM1 | Selection |
| $V_{load} \geq 0$ | $0.5$ $+ \dfrac{V_{load}}{2V_{in}}$ | $0.5$ $- \dfrac{V_{load}}{2V_{in}}$ | $\dfrac{V_{load}}{V_{in}}$ | 0 |
| $V_{load} < 0$ | | | $\dfrac{V_{in} + V_{load}}{V_{in}}$ | $V_{in}$ |
| $V_{load} =$ $0.2\, V_{in}$ | 60% | 40% | 20% | 0(0%) |
| $V_{load}$ $= -0.2$ $V_{in}$ | 40% | 60% | 80% | $V_{in}(100\%)$ |
| $V_{load}$ $= 0.3\, V_{in}$ | 65% | 35% | 30% | 0(0%) |
| $V_{load}$ $= 0V$ | 50% | 50% | 0% | 0(0%) |

Start stage (α)

Step 1

Step 3 : Final stage (β)

CIRCUIT ARRANGEMENT AND METHOD OF FORMING THE SAME

TECHNICAL FIELD

Various aspects of this disclosure relate to a circuit arrangement. Various aspects of this disclosure relate to a method of forming a circuit arrangement.

BACKGROUND

FIG. 1 shows a schematic of a conventional bipolar direct current (DC) converter. The bipolar converter includes a main controller 102, a first PWM driver 104, a second PWM driver 106, switches 108, 110, 112, 114, diodes 108', 110', 112', 114', inductors 116, 118 and capacitors 120, 122. The converter may additionally include a current sensor resistor 124. The converter provides DC current to the load.

The converter shown in FIG. 1 suffers from significant switching loss, has low stability, and occupies a fairly large area due to the two large inductors 116, 118.

SUMMARY

Various embodiments may relate to a circuit arrangement. The circuit arrangement may include a main controller. The circuit arrangement may also include a pulse width modulation (PWM) driver in electrical connection with the main controller. The circuit arrangement may additionally include a switch selector in electrical connection with the main controller. The circuit arrangement may also include a first switch having a control electrode in electrical connection with the pulse width modulation driver, a first controlled electrode for electrically connecting to a biasing voltage, and a second controlled electrode. The circuit arrangement may further include a second switch having a control electrode in electrical connection with the switch selector, a first controlled electrode for electrically connecting to the biasing voltage, and a second controlled electrode, The circuit arrangement may additionally include a third switch having a control electrode in electrical connection with the pulse width modulation driver, a first controlled electrode in electrical connection with the second controlled electrode of the first switch, and a second controlled electrode. The circuit arrangement may also include a fourth switch having a control electrode in electrical connection with the switch selector, a first controlled electrode in electrical connection with the second controlled electrode of the second switch, and a second controlled electrode in electrical connection with the second controlled electrode of the third switch. The circuit arrangement may include an inductor having a first end in electrical connection with the second controlled electrode of the first switch and the first controlled electrode of the third switch, and a second end. The circuit arrangement may additionally include a capacitor having a first end for electrically connecting to a first end of a load, and a second end for electrically connecting to a second end of the load. The first end of the capacitor may be in electrical connection with the second end of the inductor. The second end of the capacitor may be in electrical connection with the second controlled electrode of the second switch and the first controlled electrode of the fourth switch.

Various embodiments may relate to a method of forming a circuit arrangement. The method may include electrically connecting a pulse width modulation driver to a main controller. The method may further include electrically connecting a switch selector to the main controller. The method may also include electrically connecting a control electrode of a first switch to the pulse width modulation driver, the first switch also including a first controlled electrode for electrically connecting to a biasing voltage, and a second controlled electrode. The method may further include electrically connecting a control electrode of a second switch to the switch selector, the second switch also including a first controlled electrode for electrically connecting to the biasing voltage, and a second controlled electrode. The method may also include electrically connecting a control electrode of a third switch to the pulse width modulation driver, and electrically connecting a first controlled electrode of the third switch to the second controlled electrode of the first switch, the third switch also including a second controlled electrode. The method may additionally include electrically connecting a control electrode of a fourth switch to the switch selector, electrically connecting a first controlled electrode of the fourth switch to the second controlled electrode of the second switch, and electrically connecting a second controlled electrode of the fourth switch to the second controlled electrode of the third switch. The method may further include electrically connecting a first end of an inductor to the second controlled electrode of the first switch and the first controlled electrode of the third switch, the indicator also including a second end. The method may additionally include electrically connecting a first end of a capacitor to the second end of the inductor and electrically connecting a second end of the capacitor to the second controlled electrode of the second switch and the first controlled electrode of the fourth switch, the first end of the capacitor also for electrically connecting to a first end of a load, and the second end of the capacitor also for electrically connecting to a second end of the load.

BRIEF DESCRIPTION OF THE DRAWINGS

The invention will be better understood with reference to the detailed description when considered in conjunction with the non-limiting examples and the accompanying drawings, in which:

FIG. 5A shows a table comparing the inputs required for a conventional circuit arrangement to achieve various load voltages, as well as the inputs required for an embodiment of the present disclosure to achieve various load voltages according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or circuit arrangements are analogously valid for the other methods or circuit arrangements. Similarly, embodiments described in the context of a method are analogously valid for a circuit arrangement, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a" "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may seek to address or mitigate issues faced by conventional resonators.

Figure 1:
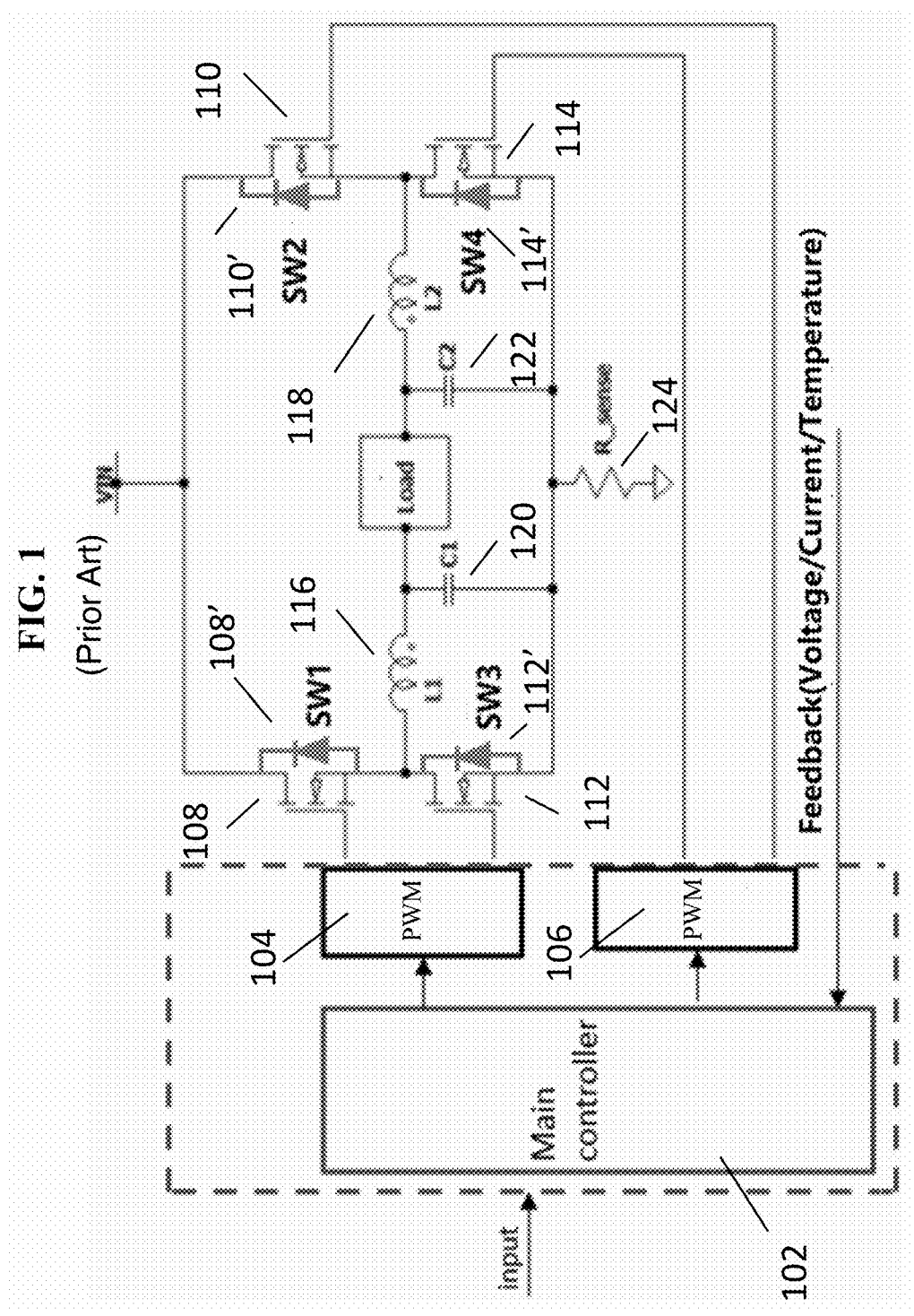
FIG. 1 shows a schematic of a conventional bipolar direct current (DC) converter.
Figure 2:
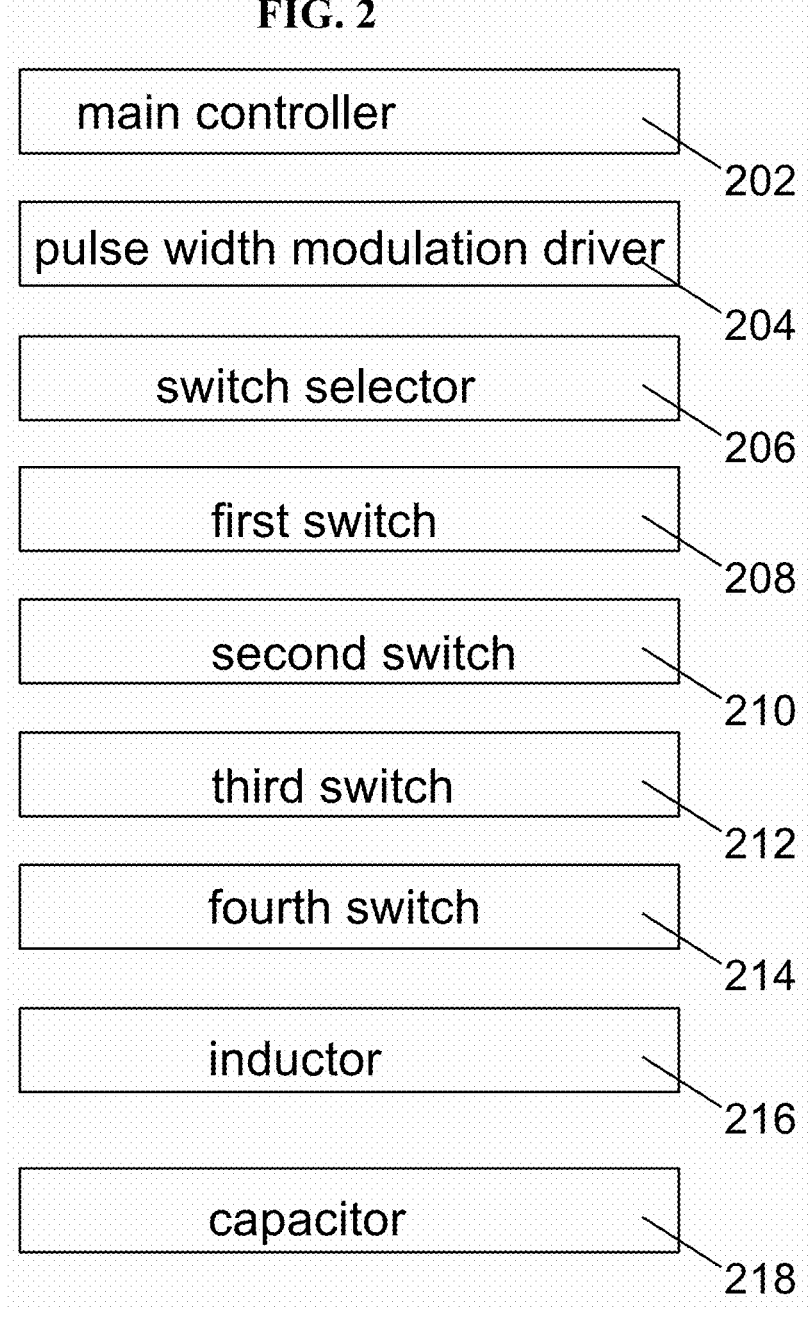
FIG. 2 shows a general illustration of a circuit arrangement according to various embodiments.

FIG. 2 shows a general illustration of a circuit arrangement according to various embodiments. The circuit arrangement may be a DC converter. The circuit arrangement may include a main controller 202. The circuit arrangement may also include a pulse width modulation (PWM) driver 204 in electrical connection with the main controller 202. The circuit arrangement may additionally include a switch selector 206 in electrical connection with the main controller 202. The circuit arrangement may also include a first switch 208 having a control electrode in electrical connection with the pulse width modulation driver 204, a first controlled electrode for electrically connecting to a biasing voltage, and a second controlled electrode. The circuit arrangement may further include a second switch 210 having a control electrode in electrical connection with the switch selector 206, a first controlled electrode for electrically connecting to the biasing voltage, and a second controlled electrode, The circuit arrangement may additionally include a third switch 212 having a control electrode in electrical connection with the pulse width modulation driver 204, a first controlled electrode in electrical connection with the second controlled electrode of the first switch 208, and a second controlled electrode. The circuit arrangement may also include a fourth switch 214 having a control electrode in electrical connection with the switch selector 206, a first controlled electrode in electrical connection with the second controlled electrode of the second switch 210, and a second controlled electrode in electrical connection with the second controlled electrode of the third switch 212. The circuit arrangement may include an inductor 216 having a first end in electrical connection with the second controlled electrode of the first switch 208 and the first controlled electrode of the third switch 212, and a second end. The circuit arrangement may additionally include a capacitor 218 having a first end for electrically connecting to a first end of a load, and a second end for electrically connecting to a second end of the load. The first end of the capacitor 218 may be in electrical connection with the second end of the inductor 216. The second end of the capacitor 218 may be in electrical connection with the second controlled electrode of the second switch 210 and the first controlled electrode of the fourth switch 214.

For avoidance of doubt, FIG. 2 seeks to illustrate some of the features of the circuit arrangement according to various embodiments, and is not intended to limit the shape, size, arrangement, orientation etc. of the various features.

By including only one inductor 216, the area occupied by the circuit arrangement may be reduced. In addition, various embodiments may also reduce the switching loss, and/or improve stability. The switch selector 206 may include a discrete circuit or a pulse width modulation driver that is configured to switch operating at between a 0% mode and a 100% mode. By using a switch selector 206 instead of a PWM driver in one side of the circuit arrangement, the switching loss may be reduced and voltage stability across the load can be improved. Switching loss may refer to loss that occur when the switches transition between the on state (activated state) and the off state (deactivated state).

In various embodiments, the first switch 208, the second switch 210, the third switch 212 and/or the fourth switch 214 may be transistors, such as metal oxide semiconductor field effect transistors (MOSFETs) or an insulated gate bipolar transistors (IGBTs). In yet various other embodiments, the first switch 208, the second switch 210, the third switch 212 and/or the fourth switch 214 may be any suitable device that can turn on or turn off the current via an external signal. In various embodiments, the control electrode of a MOSFET or IGBT may be referred to as a gate electrode. In various embodiments, the first controlled electrode may be referred to as a source/emitter electrode and the second controlled electrode may be referred to as a drain/collector electrode, while in various other embodiments, the first controlled electrode may be referred to as a drain/collector electrode and the second controlled electrode may be referred to as a source/emitter electrode.

In various embodiments, the first switch 208, the second switch 210, the third switch 212 and/or the fourth switch 214 may n-channel MOSFETs (NMOS), while in various other embodiments, the first switch 208, the second switch 210, the third switch 212 and/or the fourth switch 214 may be p-channel MOSFETs (PMOS). In other words, each of the first switch 208, the second switch 210, the third switch 212 and the fourth switch 214 may be any one device selected from a group consisting of a n-channel metal oxide semiconductor transistor, a p-channel metal oxide semiconductor transistor, and an insulated-gate bipolar transistor. However, in various embodiments, the first switch 208, the second switch 210, the third switch 212 and/or the fourth switch 214 may be any device that is able control current on/off.

In various embodiments, the second controlled electrode of the third switch 212 and the second controlled electrode of the fourth switch 214 may be configured to be biased to a further biasing voltage, e.g. 0V or ground.

In various other embodiments, the circuit arrangement may include a current sensor resistor having a first end in electrical connection with the second controlled electrode of the third switch 212 and the second controlled electrode of the fourth switch 214, and a second end for biasing to a further biasing voltage, e.g. ground.

In various embodiments, the switch selector 206 may be configured to activate the second switch 210 and deactivate the fourth switch 214 to flow a first current in a first direction through the load. The switch selector 206 may be configured to deactivate the second switch 210 and activate the fourth switch 214 to flow a second current in a second direction opposite the first direction through the load.

In the current context, activating a switch or a transistor may refer to turning on the switch or the transistor such that a substantial current (a current greater than the subthreshold current) flows through the switch or transistor. The transistor may be activated by applying a suitable voltage at the control electrode of the transistor. Likewise, deactivating a switch or a transistor may refer to turning off the switch or transistor such that no current or only an insubstantial current (e.g. subthreshold current) flows through the switch or the transistor. The transistor may be deactivated by applying another suitable voltage at the control electrode of the transistor that is different from the suitable voltage applied to activate the transistor.

In various embodiments, a voltage at the second controlled electrode of the first switch 208 and the first controlled electrode of the third switch 212 may be based on a pulse width modulation cycle of a control signal provided by the pulse width modulation driver 204 and the biasing voltage.

All switches may be digitally controlled. Each of the first switch 208, the second switch 210, the third switch 212 and the fourth switch 214 may be digitally controlled. Electrical connections electrically connecting to switches may be directly connected wire or via through isolated methods such as optical coupling, transform coupling etc.

In various embodiments, the capacitor 218 may be a filter capacitor connected to two ends of the load. The addition of any high capacitance capacitor on either side terminal of the load to any fixed voltage point (like input power or ground) may cause negative impact to the system in terms of rush current performance.

In various embodiments, the main controller 202 may control the pulse width modulation driver 204 by providing a digital signal to the pulse width driver 204. Likewise, the main controller 202 may control the switch selector 206 by providing a digital signal to the switch selector 206. In various embodiments, the signals provided by the pulse width modulation drive 204 to the first switch 208 and to the third switch 212 are digital signals. Likewise, the signals provided by the switch selector 206 to the second switch 210 and to the fourth switch 214 are digital signals. The use of digital signals may allow for a wider selection of the switching device based on different applications. In addition, control signal isolation may be easily carried out when required. A digital signal may be defined as a signal that operates at two discrete states, i.e. an "on" state and an "off" state. On the other hand, an analog signal may continuously be variable between two values.

In various embodiments, the main controller 202 may include an input port or electrode configured to receive an external input signal, the main controller configured to control the pulse width modulation driver 204 and the switch selector 206 based on the external input signal.

In various embodiments, the main controller 202 may be further configured to control the pulse width modulation driver 204 and the switch selector 206 based on a feedback signal. The feedback signal may be based on one or more sensing conditions selected from a group consisting of a detection voltage, a detection current and a temperature.

In various embodiments, the circuit arrangement may include a snubber (e.g. a resistor-capacitor or RC snubber) having a first end in electrical connection with the first controlled electrode of the third switch 212, and a second end in electrical connection with the second controlled electrode of the third switch 212. In various other embodiments, the circuit arrangement may include a snubber having a first end in electrical connection with the first controlled electrode of the fourth switch 214, and a second end in electrical connection with the second controlled electrode of the fourth switch 214.

In various embodiments, the circuit arrangement may include a resistor divider configured to determine a voltage at the first end of the capacitor 218 or the second end of the capacitor 218.

In various embodiments, the circuit arrangement may include the load. The load may include a thermoelectric cooler (TEC).

Figure 3:
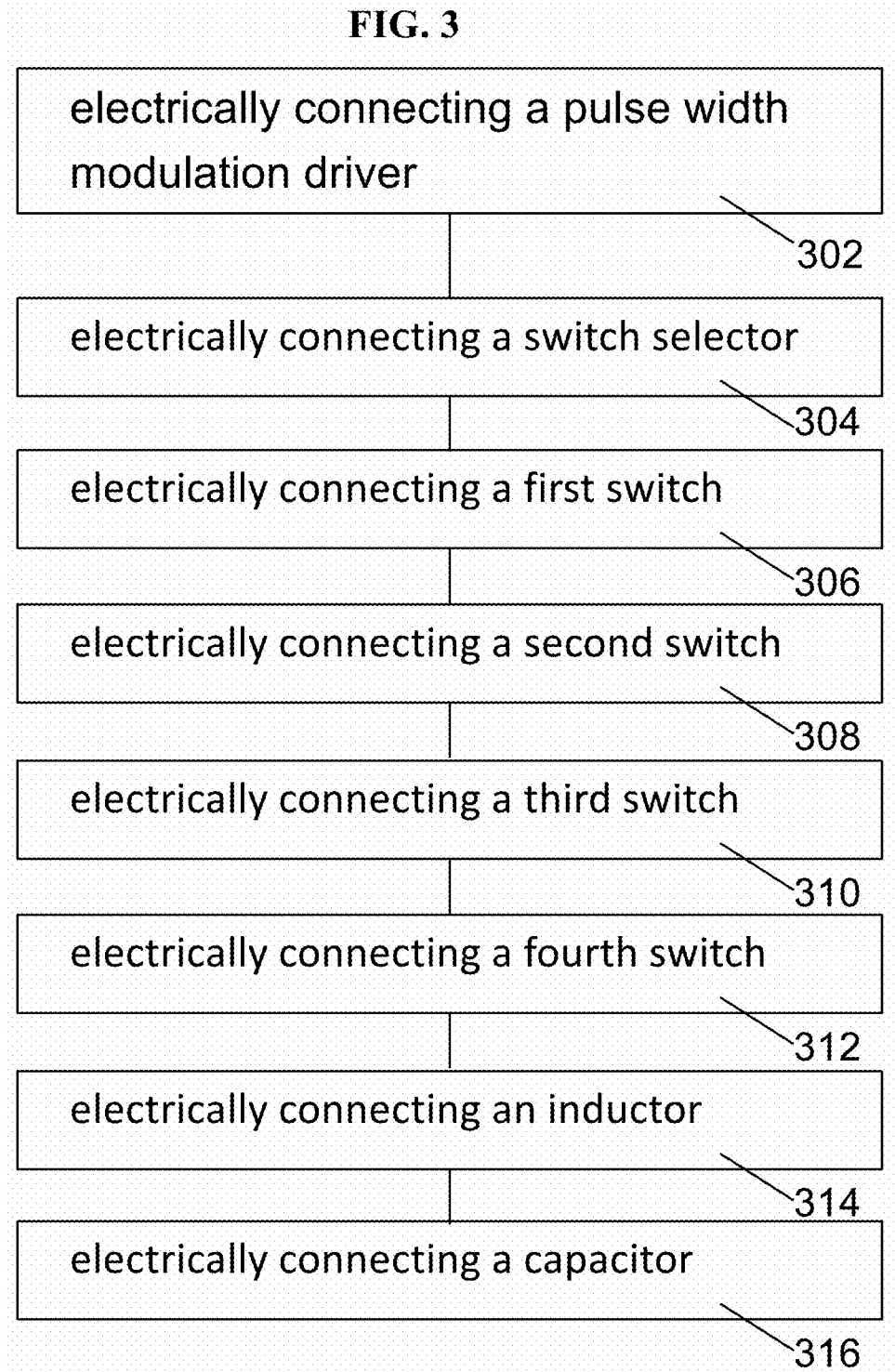
FIG. 3 shows a general illustration of a method of forming a circuit arrangement according to various embodiments.

FIG. 3 shows a general illustration of a method of forming a circuit arrangement according to various embodiments. The method may include, in 302, electrically connecting a pulse width modulation driver to a main controller. The method may further include, in 304, electrically connecting a switch selector to the main controller. The method may also include, in 306, electrically connecting a control electrode of a first switch to the pulse width modulation driver, the first switch also including a first controlled electrode for electrically connecting to a biasing voltage, and a second controlled electrode. The method may further include, in 308, electrically connecting a control electrode of a second switch to the switch selector, the second switch also including a first controlled electrode for electrically connecting to the biasing voltage, and a second controlled electrode. The method may also include, in 310, electrically connecting a control electrode of a third switch to the pulse width modulation driver, and electrically connecting a first controlled electrode of the third switch to the second controlled electrode of the first switch, the third switch also including a second controlled electrode. The method may additionally include, in 312, electrically connecting a control electrode of a fourth switch to the switch selector, electrically connecting a first controlled electrode of the fourth switch to the second controlled electrode of the second switch, and electrically connecting a second controlled electrode of the fourth switch to the second controlled electrode of the third switch. The method may further include, in 314, electrically connecting a first end of an inductor to the second controlled electrode of the first switch and the first controlled electrode of the third switch, the indicator also including a second end. The method may additionally include, in 316, electrically connecting a first end of a capacitor to the second end of the inductor and electrically connecting a second end of the capacitor to the second controlled electrode of the second switch and the first controlled electrode of the fourth switch, the first end of the capacitor also for electrically connecting to a first end of a load, and the second end of the capacitor also for electrically connecting to a second end of the load.

For avoidance of doubt, FIG. 3 is not intended to be in sequence. For instance, step 306 can occur before, after or at the same time as step 308.

In various embodiments, the second controlled electrode of the third switch and the second controlled electrode of the fourth switch may be configured to be biased to a further biasing voltage, e.g. ground.

In various other embodiments, the method may include electrically connecting a first end of a current sensor resistor to the second controlled electrode of the third switch and the second controlled electrode of the fourth switch. The current sensor resistor may include a second end for biasing to a further biasing voltage, e.g. ground.

In various embodiments, the switch selector may be configured to activate the second switch and deactivate the fourth switch to flow a first current in a first direction through the load. The switch selector may be configured to deactivate the second switch and activate the fourth switch to flow a second current in a second direction opposite the first direction through the load.

In various embodiments, a voltage at the second controlled electrode of the first switch and the first controlled electrode of the third switch may be based on a pulse width modulation cycle of a control signal provided by the pulse width modulation driver and the biasing voltage.

In various embodiments, the main controller may include an input port configured to receive an external input signal, the main controller configured to control the pulse width modulation driver and the switch selector based on the external input signal.

In various embodiments, the main controller may be further configured to control the pulse width modulation driver and the switch selector based on a feedback signal. The feedback signal may be based on one or more sensing conditions selected from a group consisting of a detection voltage, a detection current and a temperature.

In various embodiments, the method may include electrically connecting a first end of a snubber to the first controlled electrode of the third switch. The method may also include electrically connecting a second end of the snubber to the second controlled electrode of the third switch.

In various other embodiments, the method may include electrically connecting a first end of a snubber to the first controlled electrode of the fourth switch. The method may also include electrically connecting a second end of the snubber to the second controlled electrode of the fourth switch.

In various embodiments, the method may include providing a resistor divider configured to determine a voltage at the first end of the capacitor or the second end of the capacitor.

After removing a LC filter from a conventional DC converter, three challenges would need to be overcome. They are: (1) how to avoid the PWM waveform from being directly applied onto the load wire (normally, the load device is connected to the controller through long wire; however, applying PWM waveform on this wire may cause electromagnetic interference (EMI) issues); (2) how to achieve a smooth voltage polarity transient; and (3) how to turn on the MOSFET at 100% ratio. As all these challenges have not been addressed till date, conventional solutions utilize dual inductor solutions for high power bipolar DC-DC systems.

Various embodiments may address some or all of the abovementioned challenges for industrial applications such as temperature control, DC motor control etc.

Figure 4:
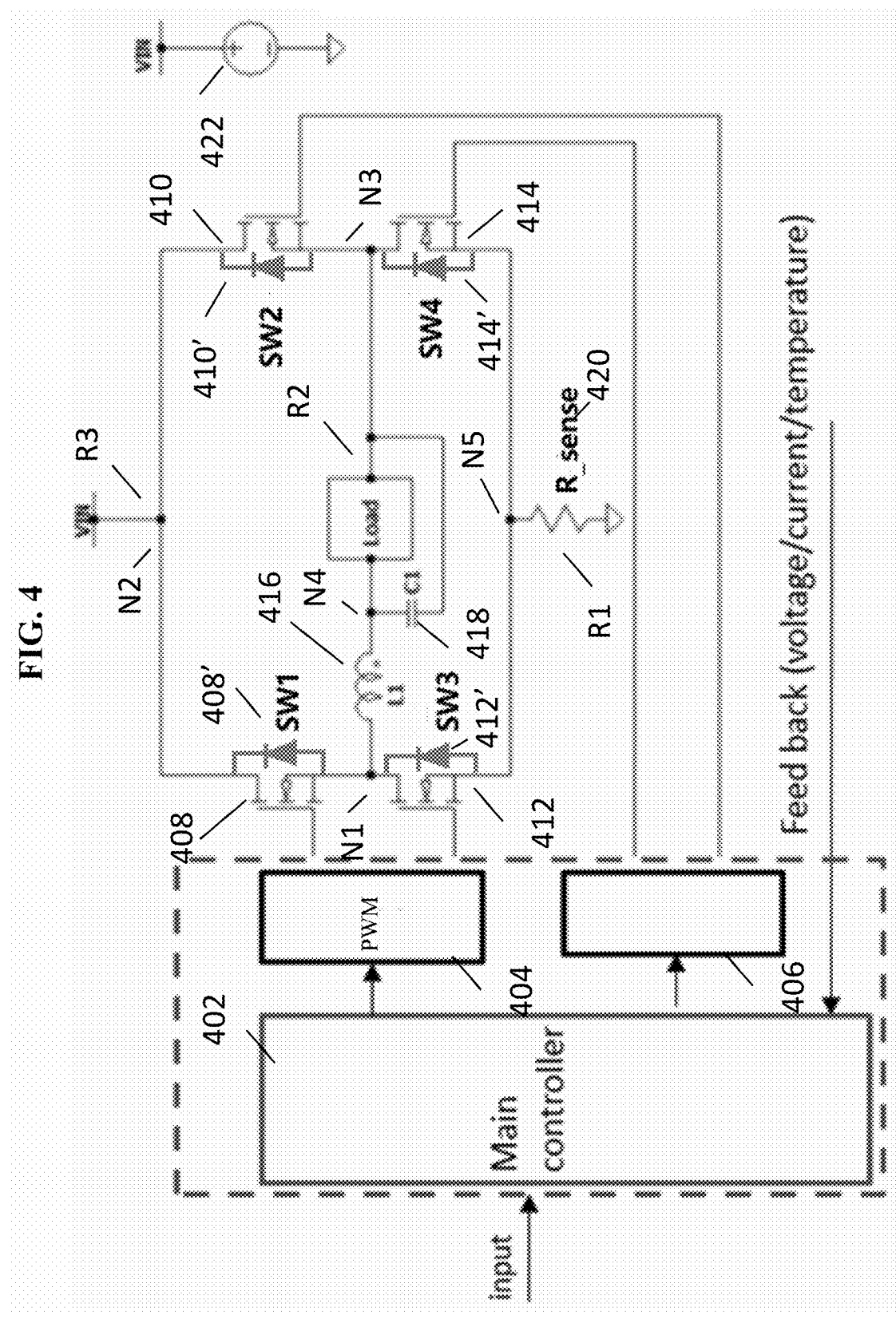
FIG. 4 shows a schematic of a circuit arrangement according to various embodiments.

FIG. 4 shows a schematic of a circuit arrangement according to various embodiments. The circuit arrangement may include a main controller 402, e.g. a microcontroller unit (MCU). The circuit arrangement may also include a pulse width modulation (PWM) driver 404 in electrical connection with the main controller 402. The circuit arrangement may additionally include a switch selector 406 in electrical connection with the main controller 402. The circuit arrangement may also include a first switch (SW1) 408 having a control electrode in electrical connection with the pulse width modulation driver 404, a first controlled electrode for electrically connecting to a biasing voltage (VIN), and a second controlled electrode. The circuit arrangement may further include a second switch (SW2) 410 having a control electrode in electrical connection with the switch selector 406, a first controlled electrode for electrically connecting to the biasing voltage (VIN), and a second controlled electrode, The circuit arrangement may additionally include a third switch (SW3) 412 having a control electrode in electrical connection with the pulse width modulation driver 404, a first controlled electrode in electrical connection with the second controlled electrode of the first switch 408, and a second controlled electrode. The circuit arrangement may also include a fourth switch (SW4) 414 having a control electrode in electrical connection with the switch selector 406, a first controlled electrode in electrical connection with the second controlled electrode of the second switch 410, and a second controlled electrode in electrical connection with the second controlled electrode of the third switch 412. The circuit arrangement may include an inductor (L1) 416 having a first end in electrical connection with the second controlled electrode of the first switch 408 and the first controlled electrode of the third switch 412, and a second end. The circuit arrangement may additionally include a capacitor (C1) 418 having a first end for electrically connecting to a first end of a load, and a second end for electrically connecting to a second end of the load, i.e. in parallel to the load. The first end of the capacitor 418 may be in electrical connection with the second end of the inductor 416. The second end of the capacitor 418 may be in electrical connection with the second controlled electrode of the second switch 410 and the first controlled electrode of the fourth switch 414.

As shown in FIG. 4, the circuit arrangement may include an optional current sensor resistor (R_Sense) 420 having a first end in electrical connection with the second controlled electrode of the third switch and the second controlled electrode of the fourth switch, and a second end for biasing to a further biasing voltage, e.g. ground or 0V. However, it may be envisioned in various other embodiments, the circuit arrangement may not include the current sensor resistor 420. In such a case, the second controlled electrode of the third switch 412 and the second controlled electrode of the fourth switch 414 may be configured to be biased to the further biasing voltage, e.g. ground or 0V. The first switch 408, the second switch 410, the third switch 412 and the fourth switch 414 may be MOSFETS such as n-channel MOSFETS or p-channel MOSFETs. It may also be envisioned that the first switch 408, the second switch 410, the third switch 412 and the fourth switch may be or insulated-gate bipolar transistor (IGBT) or any other type of device that is able control current on/off. The circuit arrangement may also include diodes 408', 410', 412" 414' electrically connected in parallel to the first switch 408, the second switch 410, the third switch 412 and the fourth switch 414 respectively. The first end of the diodes 408', 410', 412" 414' may be connected to the first controlled electrode, and the second end of the diodes 408', 410', 412" 414' may be connected to the second controlled electrode of the respective switches 408, 410, 412, 414. The diodes 408', 410', 412" 414' may represent MOSFET body diodes or external diodes. H-bridge circuits may include such diodes. The function of the diodes 408', 410', 412" 414' may be to provide a current decay path for the inductor when all the switches are deactivated or turned off.

Node N1 may be the node in which the second controlled electrode of the first switch 408 is connected to the first controlled electrode of the third switch 412. Node N2 may be the node in which the first controlled electrode of the first switch 408 is connected to the first controlled electrode of the second switch 410. Node N3 may be the node in which the second controlled electrode of the second switch 410 is connected to the first controlled electrode of the fourth switch 414. Node N4 may be the node in which the second end of the inductor 416 is connected to the first end of the capacitor 418. Node N5 may be the node in which the second controlled electrode of the third switch 412 is connected to the second controlled electrode of the fourth switch 414.

In various embodiments, the circuit arrangement may include a voltage source 422 configured to provide the biasing voltage VIN. The node N2 may be biased to the biasing voltage VIN. The pulse width modulation driver 404 may be able to support up to 100% duty cycle. The pulse width modulation driver 404 may be able to manipulate or control the first switch 408 and the third switch 412 based on the PWM ratio. The voltage may appear at node N1, i.e. the node connecting the second controlled electrode of the first transistor 408 and the first controlled electrode of the third switch 412, as ×PWM.

The switch selector 406 may be configured to manipulate the state of the second switch 410 and the fourth switch 414 when the voltage polarity is required to be changed. The selected switch may be closed or activated, while the other switch may be left open (i.e. deactivated). The main controller 402 may be configured to receive an external input signal (labelled as "input" in FIG. 4). The external input signal may be a digital signal, an analog signal or may be a communication command. In addition, the main controller 402 may be configured to receive a feedback signal (labelled as "feed back"). The feedback signal may be variable on parameters such as onboard voltages at various location (e,g, nodes N2, N3, N4, or N5), a temperature of the load or control object etc. The main controller 402 may manipulate or control the pulse width modulation driver 404 and the switch selector 406 to apply the desired voltage to the load based on the external input signal and/or the feedback signal. It may also be envisioned that in various embodiments, a resistor-capacitor (RC) snubber can be added, for instance, between N1 and N5 (i.e. first end of the snubber connected to the first controlled electrode of the third switch 412 and second end of the snubber connected to the second controlled electrode of the third switch 412) or between N3 and N5 (i.e. first end of the snubber connected to the first controlled electrode of the fourth switch 414 and second end of the snubber connected to the second controlled electrode of the fourth switch 414). In various embodiments, a resistor divider may be used to sense voltage of N3 or N4. In various embodiments, the circuit arrangement may include a high side current sensor, a high side current sensor resistor and/or a load current sensor resistor. Various embodiments may include a charge pump for supporting 100% turn on. If the first switch 408 and the second switch 410 are NMOS, the voltage applied to the first switch 408 and the second switch 410 may be required to be higher than VIN. As such, a voltage booster, e.g. a charge pump, may be required. In various embodiments, a voltage booster may be connected to between the pulse width modulation driver 404 and the control electrode of the first switch 408, while another voltage booster may be connected between the switch selector 406 and the control electrode of the second switch 410. In other words, the control electrode of the first switch 408 may be in electrical connection with the pulse width modulation driver 404 via a voltage booster, while the control electrode of the second switch 410 may be in electrical connection with the switch selector 406 via another voltage booster. On the other hand, if the first switch 408 and the second switch 410 are PMOS, no voltage booster may be required.

Various embodiments may include a current sensor resistor to measure load current. The current sensor resistor may normally be less than 10 mΩ, and may not have much impact in real applications. R1, R2 and R3 denote the possible locations in which the current sensor resistor may be placed. R2 may be best for accuracy without considering the costs and power loss. R1 may be more suitable for normal safety monitoring purposes with reasonable accuracy and lower costs. R1 may be accurate as the ground provides stability while for R2 and R3, both sides are subjected to variable voltages, resulting in higher noise. Also, at input of 24V and output of 6V at 16 A, R2 may have a constant current of 16 A. R1 may have 16 A passing through, but at about 25% ratio. Assuming resistance of sensor resistor is 10 mΩ, 16 A current may generate 2.56 W heat on R2, but may only generate 0.64 W heat on R1, with the average current through R1 being the power supply unit (PSU) current ($V_{IN} \times I_{IN} = V_{load} \times I_{load} \rightarrow I_{load} \; V_{IN} \times I_{IN} / V_{load}$). Further, a low side current sensor amplifier may be cheaper.

Figure 5B:
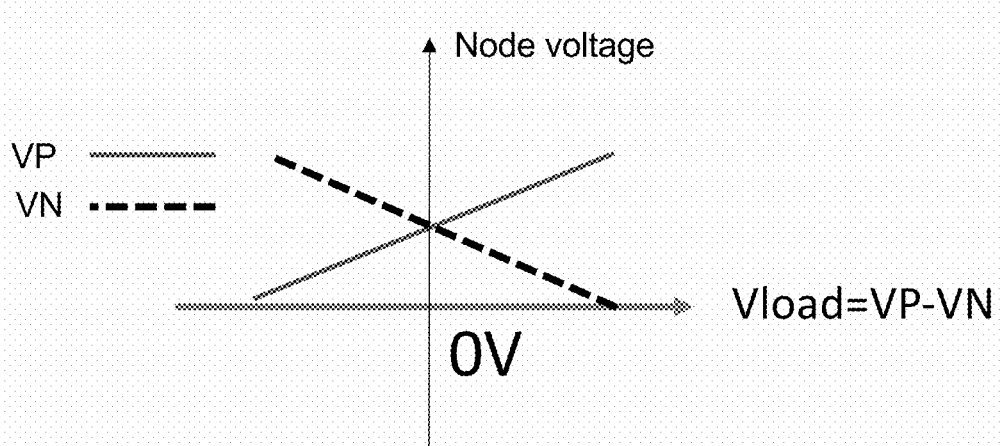
FIG. 5B shows a plot of voltage as a function of load voltage showing the variation of the voltages (VN and VP) used by the conventional circuit to achieve various load voltages (Vload).
Figure 5C:
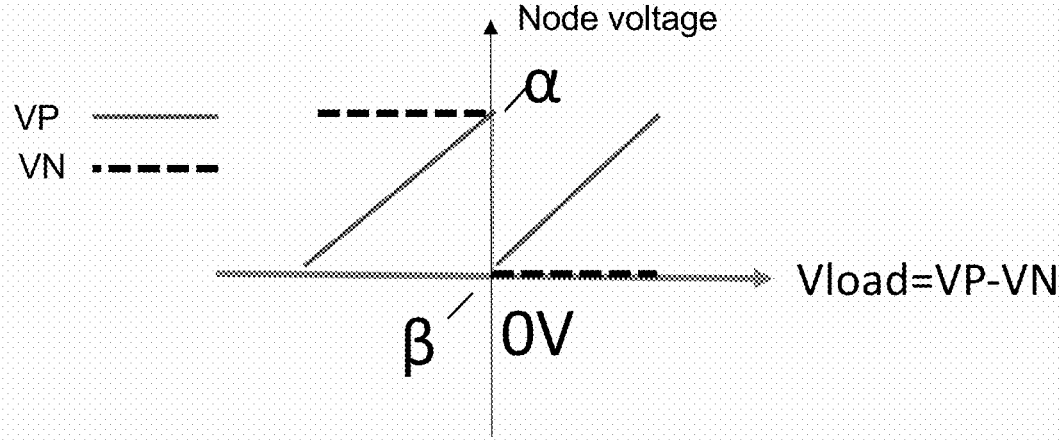
FIG. 5C shows a plot of input voltage as a function of load voltage showing the variation of the voltages (VN and VP) used by the embodiment of the present disclosure to achieve various load voltages (Vload).

FIG. 5A shows a table comparing the inputs required for a conventional circuit arrangement to achieve various load voltages, as well as the inputs required for an embodiment of the present disclosure to achieve various load voltages according to various embodiments. FIG. 5B shows a plot of voltage as a function of load voltage showing the variation of the voltages (VN and VP) used by the conventional circuit to achieve various load voltages (Vload). FIG. 5C shows a plot of input voltage as a function of load voltage showing the variation of the voltages (VN and VP) used by the embodiment of the present disclosure to achieve various load voltages (Vload). The load voltage is related to the input voltages via the formula Vload=VP−VN. "Vload" may be the voltage across the load, "VP" may be the voltage applied at a "positive" terminal of the load, while "VN" may be the voltage applied at a "negative" terminal of the load.

For the embodiment, VN, which is determined by SW2 and SW4 controlled by the switch selector, may switch between 0 and a positive fixed voltage depending on whether a positive load voltage or a negative load voltage is desired. On the other hand, VP, which is determined by SW1 and SW3 controlled by the pulse width modulation driver, may be varied by changing the duty cycle. The PWM output and therefore VP may be adjusted at predetermined frequencies based on the feedback signal.

For high power system design, in which metal oxide field effect transistors (MOSFETs) with channel resistance ($R_{ds}$) of 1 milliohm (mΩ) are used, the conductive loss may be negligible. A 10 A current may only generate 0.1 W conductive loss, which is equivalent to 0.05% efficiency impact for a 200 W system. However, switching loss may become a key factor in system power efficiency when ultra low channel resistance MOSFETs are used. Various embodiments may include one side buck connected to the switch selector which only switches when the voltage polarity is required to be varied. For some applications, the polarity change interval may be once per minute, compared to about 300,000 times per second in a pulse width modulator of a DC—DC converter. As such, the switching loss for the side buck connected to the switch selector may be considered to be negligible. Various embodiments may be able to reduce system power loss by almost 50%.

Figure 6A:
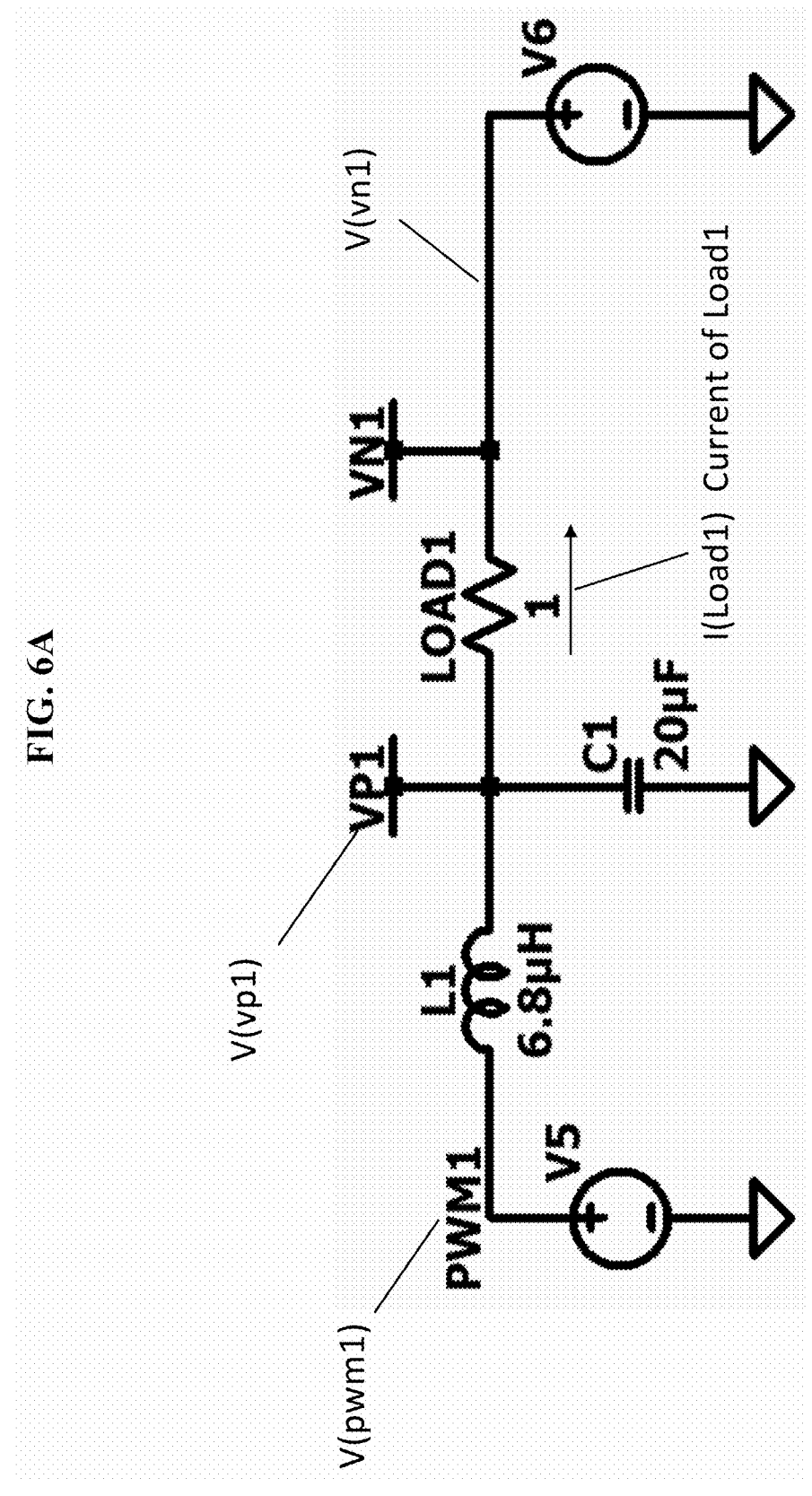
FIG. 6A shows a circuit with one side inductor-capacitor (LC) filter removed.
Figure 6B:
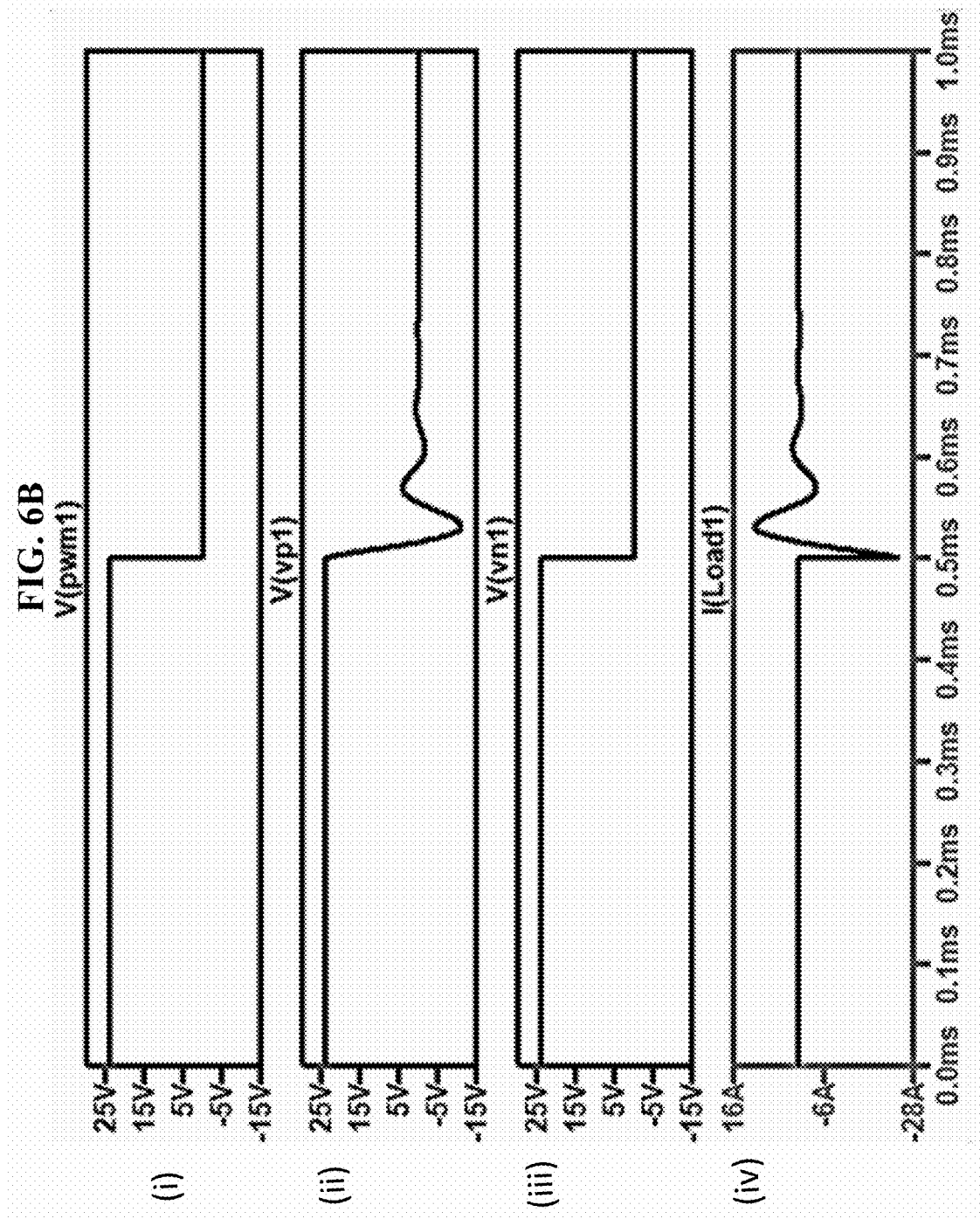
FIG. 6B illustrates (i) a plot of voltage as a function of time showing the variation of voltage V(pwm1) at an end of the voltage source V5 of the circuit shown in FIG. 6A; (ii) a plot of voltage as a function of time showing the variation of voltage V(vp1) at one end of the load of the circuit shown in FIG. 6A; (iii) a plot of voltage as a function of time showing the variation of voltage V(vn1) at another end of the load of the circuit shown in FIG. 6A; and (iv) a plot of current as a function of time showing the variation of load current (I(Load1)) passing through the load (LOAD1) of the circuit shown in FIG. 6A.

FIG. 6A shows a circuit with one side inductor-capacitor (LC) filter removed. FIG. 6B illustrates (i) a plot of voltage as a function of time showing the variation of voltage V(pwm1) at an end of the voltage source V5 of the circuit shown in FIG. 6A; (ii) a plot of voltage as a function of time showing the variation of voltage V(vp1) at one end of the load of the circuit shown in FIG. 6A; (iii) a plot of voltage as a function of time showing the variation of voltage V(vn1) at another end of the load of the circuit shown in FIG. 6A; and (iv) a plot of current as a function of time showing the variation of load current (I(Load1)) passing through the load (LOAD1) of the circuit shown in FIG. 6A. Plot (iv) of FIG. 6B shows a 20 A overshoot current on the load. This may be the main issue discouraging people from using circuit having a single side LC filter. In contrast, the embodiment highlighted in FIG. 5A may not face the issue of current overshoot, and may thus be advantageous over the circuit illustrated in FIG. 6A.

Figure 6C:
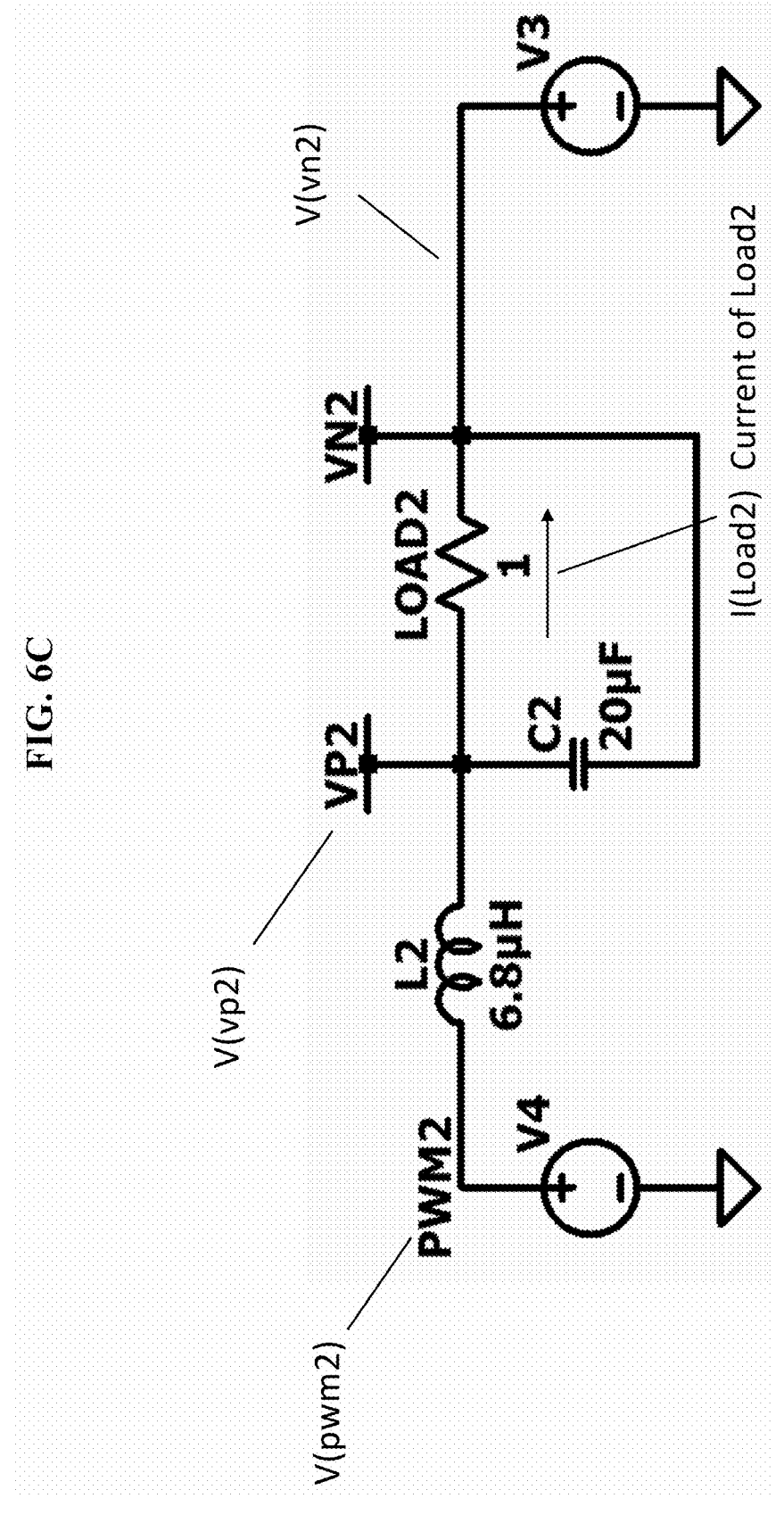
FIG. 6C shows an equivalent circuit according to an embodiment of the present disclosure.
Figure 6D:
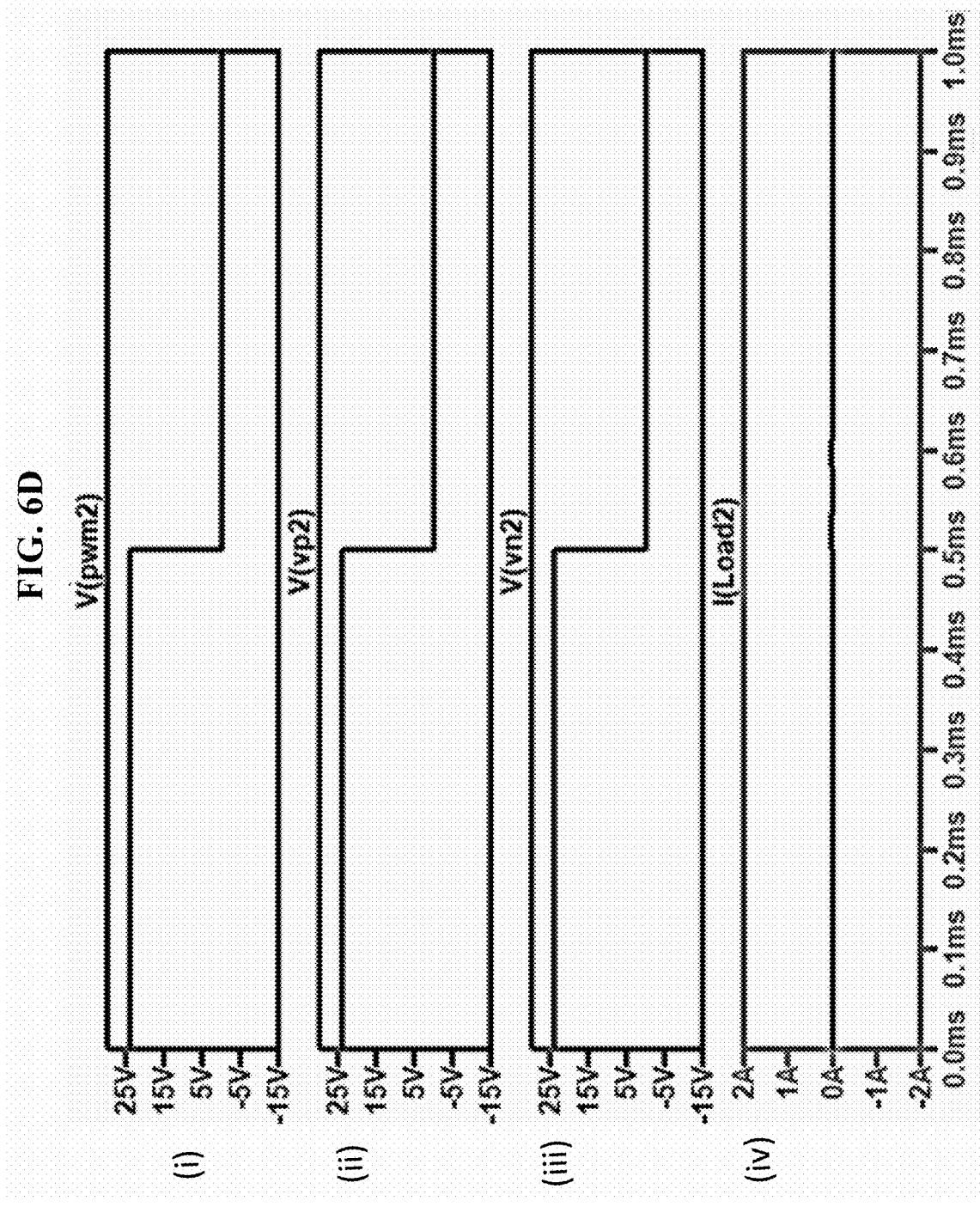
FIG. 6D illustrates (i) a plot of voltage as a function of time showing the variation of voltage V(pwm2) at an end of the voltage source V4 of the circuit shown in FIG. 6C; (ii) a plot of voltage as a function of time showing the variation of voltage V(vp2) at one end of the load of the circuit shown in FIG. 6C; (iii) a plot of voltage as a function of time showing the variation of voltage V(vn2) at another end of the load of the circuit shown in FIG. 6C; and (iv) a plot of current as a function of time showing the variation of load current (I(Load2)) passing through the load (LOAD2) of the circuit shown in FIG. 6C.

FIG. 6C shows an equivalent circuit according to an embodiment of the present disclosure. FIG. 6D illustrates (i) a plot of voltage as a function of time showing the variation of voltage V(pwm2) at an end of the voltage source V4 of the circuit shown in FIG. 6C; (ii) a plot of voltage as a function of time showing the variation of voltage V(vp2) at one end of the load of the circuit shown in FIG. 6C; (iii) a plot of voltage as a function of time showing the variation of voltage V(vn2) at another end of the load of the circuit shown in FIG. 6C; and (iv) a plot of current as a function of time showing the variation of load current (I(Load2)) passing through the load (LOAD2) of the circuit shown in FIG.

6C. By connecting the filter capacitor C2 across both ends of the load as shown in FIG. 6C, the overshoot may be reduced.

Figure 7A:
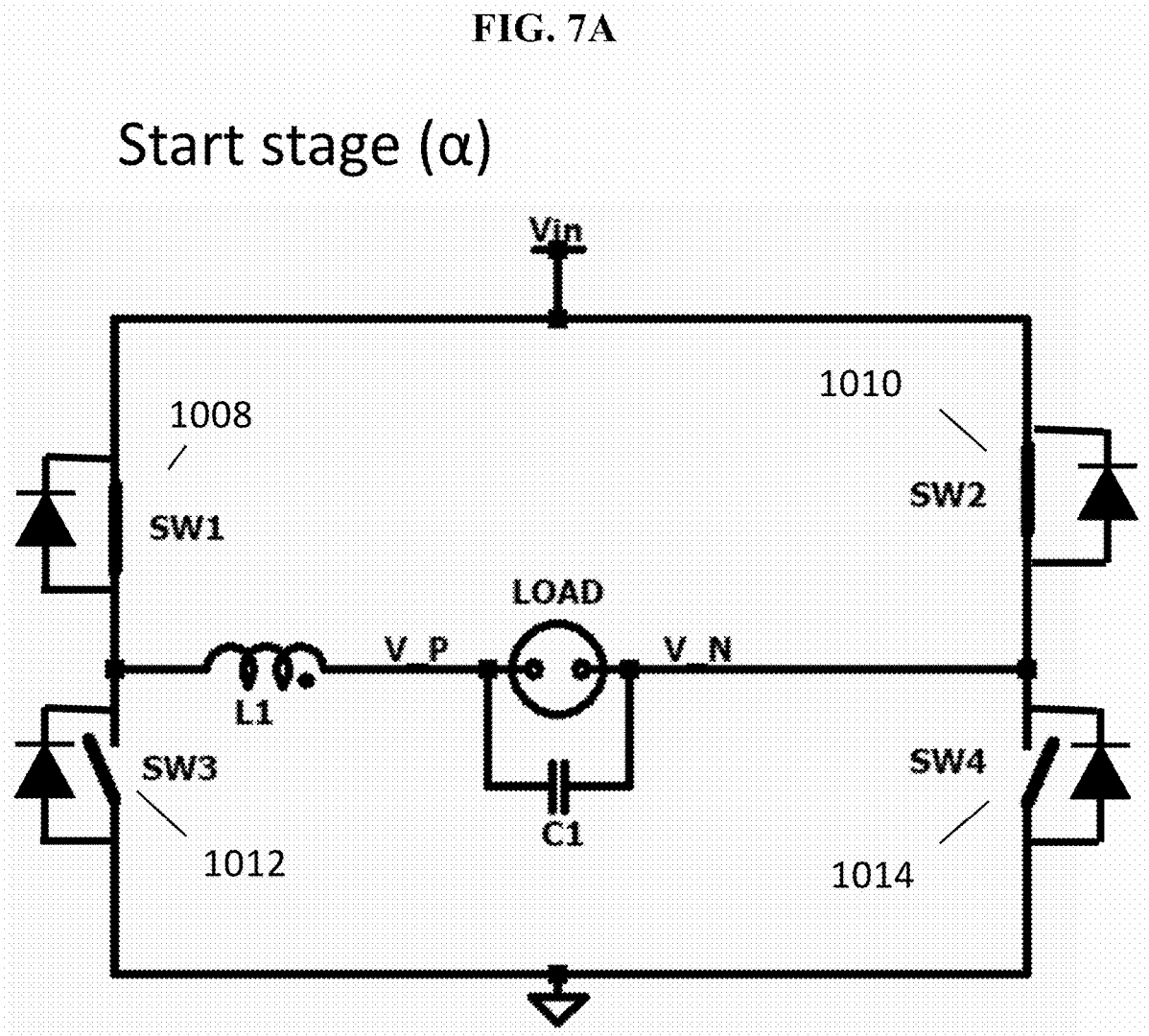
FIG. 7A shows a schematic of a portion of the circuit arrangement according to present disclosure at start stage 'α'.
Figure 7B:
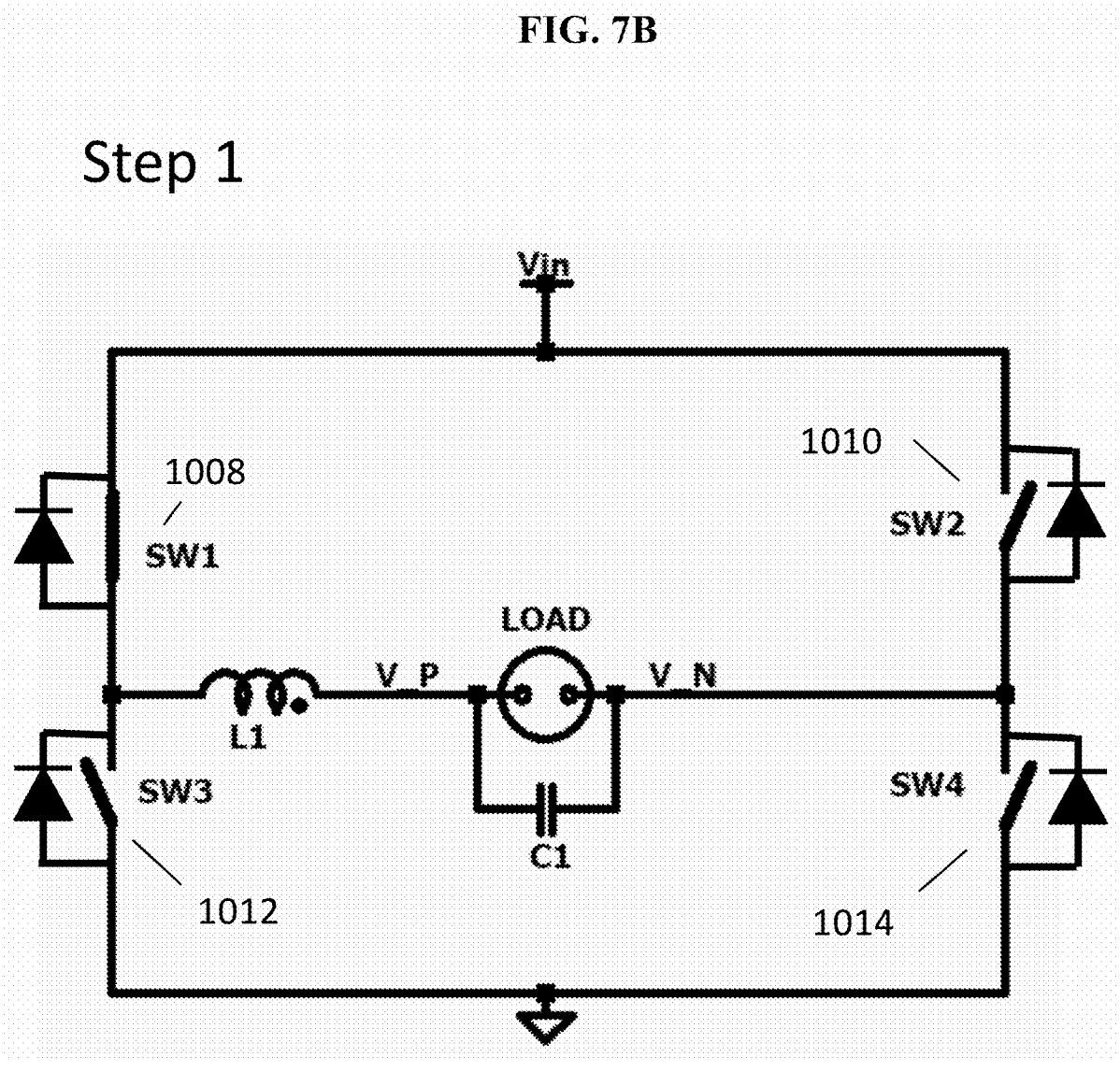
FIG. 7B shows the first step according to various embodiments of the present disclosure.
Figure 7C:
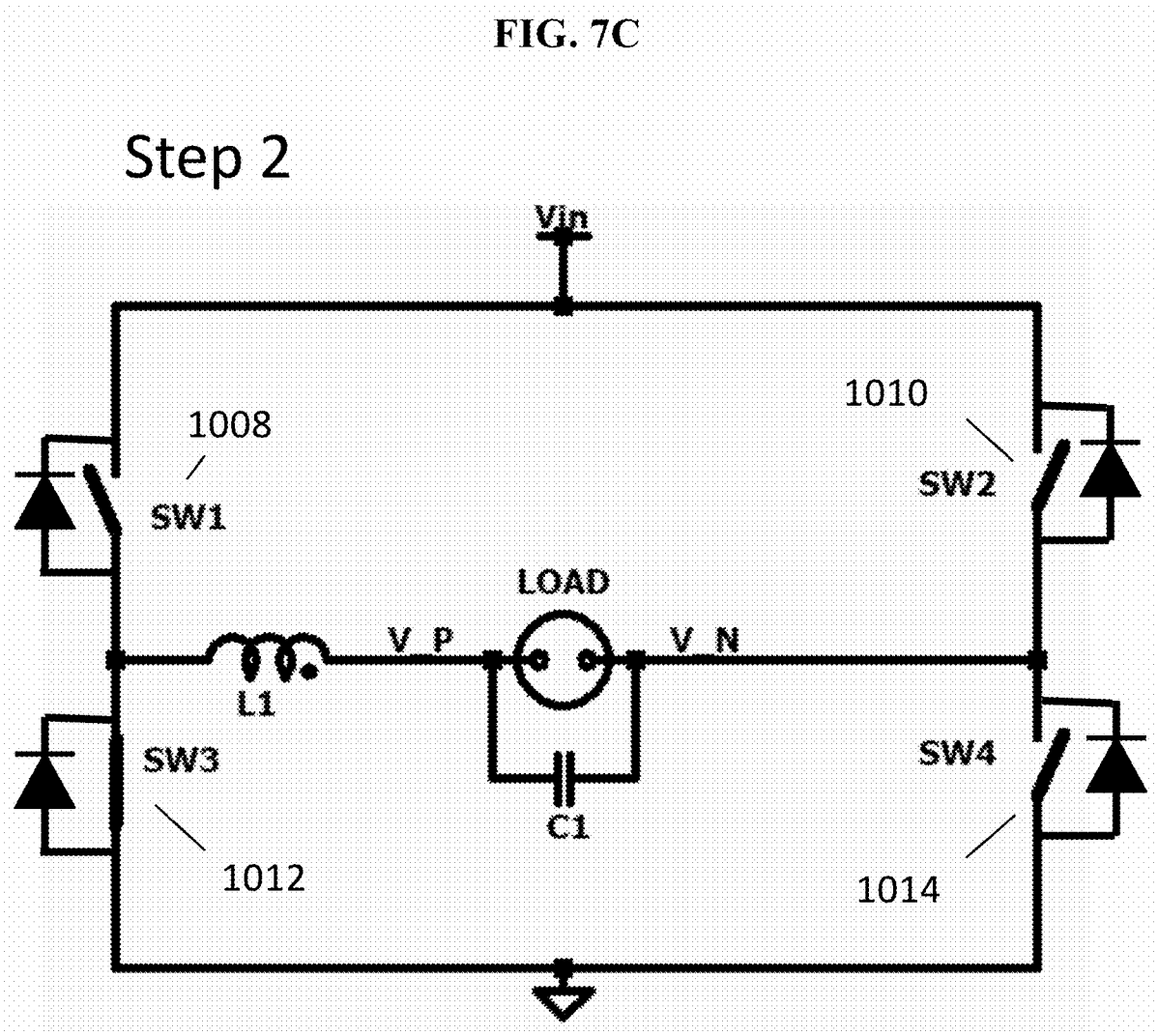
FIG. 7C shows the second step according to various embodiments of the present disclosure.
Figure 7D:
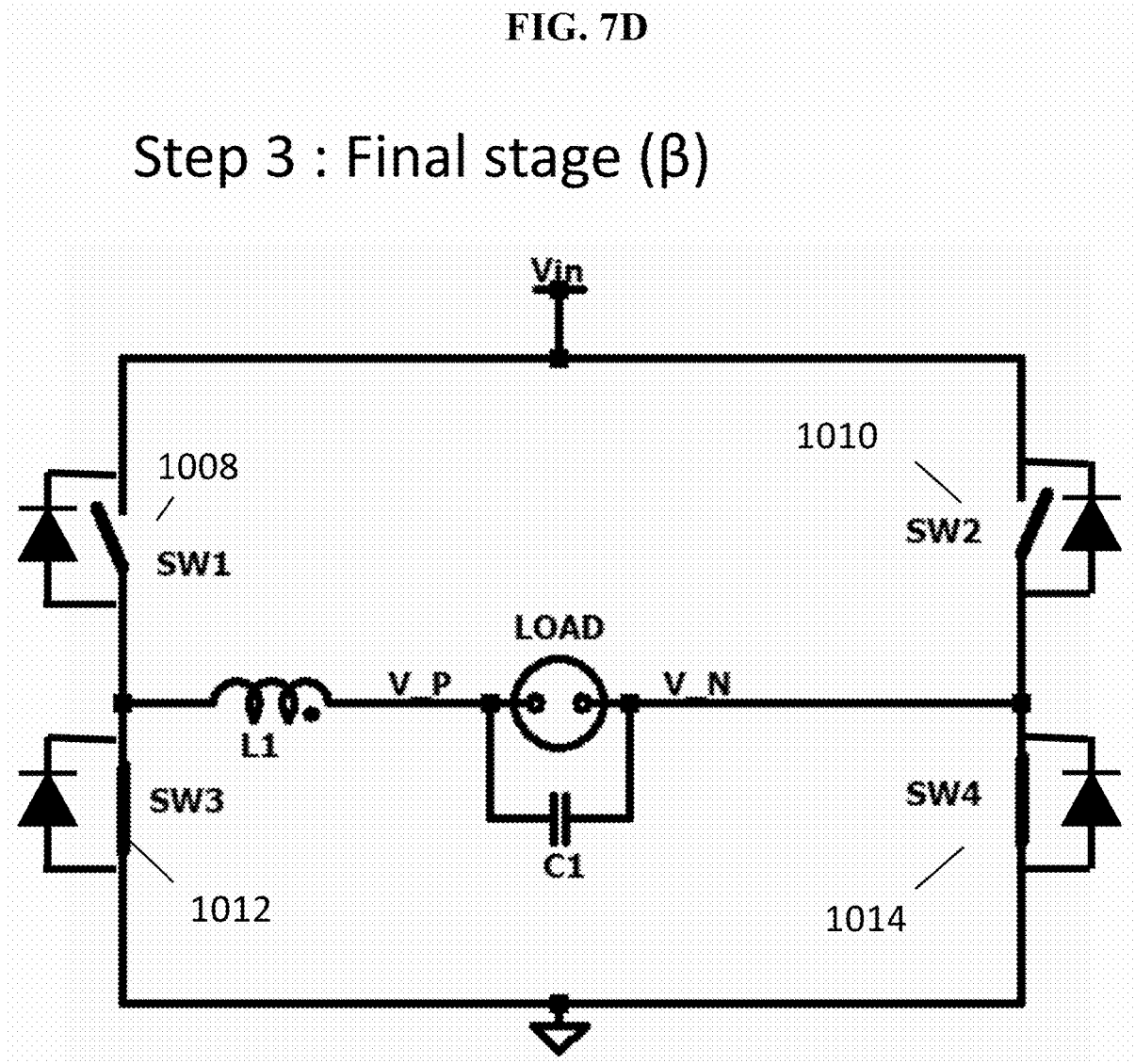
FIG. 7D shows the third step according to various embodiments of the present disclosure, resulting in the final stage 'β'.

Various embodiments may seek to prevent a sudden unexpected influx of current from flowing through the load due to abrupt changes in voltages going from α to β (load polarity change) as shown in FIG. 5C. Various embodiments may employ a three-step process to prevent the sudden influx of current due to load polarity change. FIG. 7A shows a schematic of a portion of the circuit arrangement according to present disclosure at start stage 'α'. At start stage 'α', switches 708 and 710 may be activated or turned on, while switches 712, 714 may be deactivated or turned off. FIG. 7B shows the first step according to various embodiments of the present disclosure. In the first step (step 1), the switch selector may deactivate switches 710, 714 such that no current flows through the load. The first switch 708 may remain activated, while the third switch 712 may remain deactivated. FIG. 7C shows the second step according to various embodiments of the present disclosure. In the second step (step 2), the first switch 708 may be deactivated and the third switch 712 may be activated, as controlled by the pulse width modulation driver. The switches 710, 714 may remain deactivated so that no current flows through the load. FIG. 7D shows the third step according to various embodiments of the present disclosure, resulting in the final stage 'β'. In the third step, the fourth switch 714 may be activated as controlled by the switch selector. The switches 708, 710 may remain deactivated, while the third switch 712 may remain activated. The three-step process may ultimately be controlled by the main controller as the main controller controls the operation of the pulse width modulation driver and the switch selector. The transition from 'β' stage to 'α' stage may follow a similar concept. Generally, during load voltage polarity change, the switch selector may cause both the second switch 710 and the fourth switch 714 to be deactivated first before the switches at the PWM side (i.e switches 708, 712) carries out the voltage transition. The switch selector may then activate the target switch (i.e. the second switch 710 or the fourth switch 714). The switch selector may include a discrete circuit or a pulse width modulation driver that is able to support 0% and 100% turn on ratio. If the pulse width modulator is used as a switch selector, the dead time setting may be set long enough to support new polarity required voltage to settle before the finishing of transition of the switch selector.

The invention claimed is:

1. A circuit arrangement comprising:
a main controller;
a pulse width modulation driver in electrical connection with the main controller;
a switch selector in electrical connection with the main controller;
a first switch having a control electrode in electrical connection with the pulse width modulation driver, a first controlled electrode for electrically connecting to a biasing voltage, and a second controlled electrode;
a second switch having a control electrode in electrical connection with the switch selector, a first controlled electrode for electrically connecting to the biasing voltage, and a second controlled electrode;
a third switch having a control electrode in electrical connection with the pulse width modulation driver, a first controlled electrode in electrical connection with the second controlled electrode of the first switch, and a second controlled electrode;

a fourth switch having a control electrode in electrical
connection with the switch selector, a first controlled
electrode in electrical connection with the second con-
trolled electrode of the second switch, and a second
controlled electrode in electrical connection with the
second controlled electrode of the third switch;
an inductor having a first end in electrical connection with
the second controlled electrode of the first switch and
the first controlled electrode of the third switch, and a
second end;
a capacitor having a first end for electrically connecting to
a first end of a load, and a second end for electrically
connecting to a second end of the load;
wherein the first end of the capacitor is in electrical
connection with the second end of the inductor; and
wherein the second end of the capacitor is in electrical
connection with the second controlled electrode of the
second switch and the first controlled electrode of the
fourth switch;
wherein the switch selector is configured to control the
first switch, the second switch, the third switch, and the
fourth switch to transition from a start stage to a first
switching stage, from the first switching stage to a
second switching stage, and from the second switching
stage to a third switching stage;
wherein the start stage comprises the first switch and the
second switch being closed, and the third switch and
the fourth switch being open;
wherein the first switching stage comprises one of the first
switch or the second switch being closed, another of the
first switch or the second switch being open, and the
third switch and the forth switch being open;
wherein the second switching stage comprises the first
switch and the second switch being open, one of the
third switch or the fourth switch being closed, and
another of the third switch or the fourth switch being
open; and
wherein the third switching stage comprises the first
switch and the second switch being open, and the third
switch and the fourth switch being closed.
2. The circuit arrangement according to claim 1, wherein
the second controlled electrode of the third switch and the
second controlled electrode of the fourth switch are config-
ured to be biased to a further biasing voltage.
3. The circuit arrangement according to claim 2, wherein
the further biasing voltage is ground.
4. The circuit arrangement according to claim 1, further
comprising:
a current sensor resistor having a first end in electrical
connection with the second controlled electrode of the
third switch and the second controlled electrode of the
fourth switch, and a second end for biasing to a further
biasing voltage.
5. The circuit arrangement according to claim 4, wherein
the further biasing voltage is ground.
6. The circuit arrangement according to claim 1, wherein
the switch selector is configured to activate the second
switch and deactivate the fourth switch to flow a first current
in a first direction through the load; and
wherein the switch selector is configured to deactivate the
second switch and activate the fourth switch to flow a
second current in a second direction opposite the first
direction through the load.
7. The circuit arrangement according to claim 1, wherein
a voltage at the second controlled electrode of the first
switch and the first controlled electrode of the third switch is based on a pulse width modulation cycle of a control
signal provided by the pulse width modulation driver and the
biasing voltage.
8. The circuit arrangement according to claim 1, wherein
the main controller comprises an input port configured to
receive an external input signal, the main controller config-
ured to control the pulse width modulation driver and the
switch selector based on the external input signal.
9. The circuit arrangement according to claim 8, wherein
the main controller is further configured to control the pulse
width modulation driver and the switch selector based on a
feedback signal.
10. The circuit arrangement according to claim 9, wherein
the feedback signal is based on one or more sensing condi-
tions selected from a group consisting of a detection voltage,
a detection current and a temperature.
11. The circuit arrangement according to claim 1, further
comprising: a snubber having a first end in electrical con-
nection with the first controlled electrode of the third switch,
and a second end in electrical connection with the second
controlled electrode of the third switch.
12. The circuit arrangement according to claim 1, further
comprising: a snubber having a first end in electrical con-
nection with the first controlled electrode of the fourth
switch, and a second end in electrical connection with the
second controlled electrode of the fourth switch.
13. The circuit arrangement according to claim 1, wherein
the switch selector comprises a discrete circuit or a pulse
width modulation driver that is configured to switch oper-
ating at between a 0% mode and a 100% mode.
14. The circuit arrangement according to claim 1, wherein
each of the first switch, the second switch, the third switch
and the fourth switch is any one device selected from a
group consisting of a n-channel metal oxide semiconductor
transistor, a p-channel metal oxide semiconductor transistor,
and an insulated-gate bipolar transistor.
15. The circuit arrangement according to claim 14,
wherein each of the first switch, the second switch, the third
switch and the fourth switch is digitally controlled.
16. A method of forming the circuit arrangement, the
method comprising:
electrically connecting a pulse width modulation driver to
a main controller;
electrically connecting a switch selector to the main
controller;
electrically connecting a control electrode of a first switch
to the pulse width modulation driver, the first switch
also comprising a first controlled electrode for electri-
cally connecting to a biasing voltage, and a second
controlled electrode;
electrically connecting a control electrode of a second
switch to the switch selector, the second switch also
comprising a first controlled electrode for electrically
connecting to the biasing voltage, and a second con-
trolled electrode;
electrically connecting a control electrode of a third
switch to the pulse width modulation driver, and elec-
trically connecting a first controlled electrode of the
third switch to the second controlled electrode of the
first switch, the third switch also comprising a second
controlled electrode;
electrically connecting a control electrode of a fourth
switch to the switch selector, electrically connecting a
first controlled electrode of the fourth switch to the
second controlled electrode of the second switch, and electrically connecting a second controlled electrode of the fourth switch to the second controlled electrode of the third switch;

electrically connecting a first end of an inductor to the second controlled electrode of the first switch and the first controlled electrode of the third switch, the indicator also comprising a second end;

electrically connecting a first end of a capacitor to the second end of the inductor and electrically connecting a second end of the capacitor to the second controlled electrode of the second switch and the first controlled electrode of the fourth switch, the first end of the capacitor also for electrically connecting to a first end of a load, and the second end of the capacitor also for electrically connecting to a second end of the load;

wherein the switch selector is configured to control the first switch, the second switch, the third switch, and the fourth switch to transition from a start stage to a first switching stage, from the first switching stage to a second switching stage, and from the second switching stage to a third switching stage;

wherein the start stage comprises the first switch and the second switch being closed, and the third switch and the fourth switch being open;

wherein the first switching stage comprises one of the first switch or the second switch being closed, another of the first switch or the second switch being open, and the third switch and the forth switch being open;

wherein the second switching stage comprises the first switch and the second switch being open, one of the third switch or the fourth switch being closed, and another of the third switch or the fourth switch being open; and wherein the third switching stage comprises the first switch and the second switch being open, and the third switch and the fourth switch being closed.

17. The method according to claim 16, wherein the second controlled electrode of the third switch and the second controlled electrode of the fourth switch are configured to be biased to a further biasing voltage.

18. The method according to claim 17, wherein the further biasing voltage is ground.

19. The method according to claim 16, further comprising: electrically connecting a first end of a current sensor resistor to the second controlled electrode of the third switch and the second controlled electrode of the fourth switch, wherein the current sensor resistor comprises a second end for biasing to a further biasing voltage.

20. The circuit arrangement of claim 1, wherein the main controller is configured to manage bias voltage switching during output polarity transitions by controlling the pulse width modulation driver to enter a high-impedance state during or in response to polarity transitions, thereby decoupling bias voltage control from pulse width modulation; wherein the main controller is configured to receive an input signal consisting essentially of two discrete voltage levels, and to control the pulse width modulation driver and the control switch based on the input signal.

* * * * *